United States Patent [19]

Yamasaki et al.

[11] Patent Number: 5,060,049
[45] Date of Patent: Oct. 22, 1991

[54] MULTIPLE RESISTIVITY WIRING APPARATUS

[75] Inventors: Kozo Yamasaki, Gifu; Kouichi Mouri; Naomiki Kato, both of Aichi, all of Japan; Mitsuru Hirano, Santa Clara, Calif.; Michael A. Schmitt; Bidyut Bhattacharyya, both of Chandler, Ariz.

[73] Assignees: NGK Spark Plug Co., Ltd., Aichi, Japan; NGK Spark Plugs (U.S.A.), Inc., Torrance, Calif.; Intel Corporation, Chandler, Ariz.

[21] Appl. No.: 553,804

[22] Filed: Jul. 18, 1990

[30] Foreign Application Priority Data

Jul. 21, 1989 [JP] Japan .................. 1-189230

[51] Int. Cl.⁵ .................. H01L 23/54; H01L 23/14
[52] U.S. Cl. .................. 357/70; 357/80; 357/67
[58] Field of Search .................. 357/70, 69, 80, 67; 437/187, 206, 217, 220

[56] References Cited

U.S. PATENT DOCUMENTS 3,927,815 12/1975 Mase et al. .................. 357/67

FOREIGN PATENT DOCUMENTS 59-169163 9/1984 Japan .................. 357/70

Primary Examiner—Andrew J. James
Assistant Examiner—S. V. Clark
Attorney, Agent, or Firm—Finnegan, Henderson, Farabow, Garrett, and Dunner

[57] ABSTRACT

A ceramic multilayer wiring substrate is provided on which the metallized wirings are partially altered to provide multiple resistivities without changing the other electrical properties associated with a particular physical wiring geometry. Sequentially positioning conductive materials of different resistivities along the length of each individual wiring produces a final wiring pattern where each individual wiring can have a different resistance from the other wirings. A multiple resistivity wiring pattern can maximize the operation of a semiconductor chip attached thereto, for example, by reducing the effect of electronic noise on the semiconductor.

20 Claims, 2 Drawing Sheets

MULTIPLE RESISTIVITY WIRING APPARATUS

BACKGROUND OF THE INVENTION

1. Field of the Invention

The present invention relates to a ceramic multilayer wiring substrate in which the electrical resistance values of the signal lines to a semiconductor chip are partially changed in the same plane or on the same substrate.

2. Description of the Prior Art

It is generally known that if the electrical resistivity of specific metal wirings from a group of metal wirings is altered, the electrical characteristics of a semiconductor chip can be maximized. The electrical resistance is altered to solve various electrical problems such as switching noise (ex. "ringing", "voltage input high") and the like generated during the operation of the semiconductor chip mounted thereon. For example, to reduce switching noises, one must establish matching impedance between the semiconductor chip and the multilayer wiring substrate. In order to satisfy this requirement, the electrical resistivity of the metallic wirings to which the chip is connected must be altered. Such adjustments of resistivity can also compensate for advancements on the semiconductor itself with respect to density of integration and operational speed (frequency).

Conventionally, if the electrical resistivities of a specific number of metallized wirings were to be changed, two approaches were available: (a) generally, the width of each affected metallized wiring would be changed, or (b) a resistor would be added in the wiring circuit to the outside of the ceramic multilayer wiring substrate or embedded in the substrate if necessary.

In improving the density of integration and the operational speed (frequency) of a semiconductor chip, several of these problems are brought to the foreground.

In the first approach, the width of the metallized wirings is altered. However, as semiconductor chips are improved with respect to density of integration and operational speed, they require still more metallized wirings than are currently utilized. The multilayer substrate is of limited size and can accommodate only a certain total area of metallized wirings. Thus, as chip technology advances, there is a limit to which this method may address that technology. Moreover, adding additional metallized wirings and/or changing the spatial configuration of the wirings alters the electrical characteristics of the wirings (e.g. capacitance) This is not necessarily a beneficial change.

The second approach or method for changing the electrical resistivity of the metallized wirings involves the use of a resistor either above the surface or embedded into the surface of the multilayer wiring substrate. The reliability and durability of this addition is poor. Moreover, production costs are increased, because the addition of the resistor(s) requires additional materials and manufacturing steps.

SUMMARY OF THE INVENTION

The present invention was developed in view of the foregoing difficulties. In solving the problems associated with the prior art, "ringing" and "voltage input high" are suppressed below a threshold level. As a result, one can obtain a large margin relative to the ground so that the number of pins for ground lines and power lines can be reduced.

The problems of the prior art are addressed by the present invention in three primary ways. First, a select number of the metallized wirings of a wiring group on the same substrate can be formed using different metallizing materials having different resistivities. Second, the two metallizing materials having differing resistivities can be printed onto a single substrate and baked onto the substrate simultaneously. Third, the metallizing materials can contain high melting point metals (such as molybdenum or tungsten) combined with a quantity of insulating refractory material, thereby creating materials with two or more differing resistivity values.

As may be acquired from a practice of the invention, various ones of a wide number of advantages can be selectively achieved because of the versatility provided by the invention.

Part of that versatility resides in a range of amount of both metallic and non-metallic substances that may be employed in order to change the resistivity of selected wirings.

BRIEF DESCRIPTION OF THE DRAWINGS

Other features and advantages of the present invention will become apparent from the following detailed description thereof, as well as the practice of the invention, the description between taken together with the drawing, in which.

DESCRIPTION OF THE PREFERRED EMBODIMENT

Figure 1:
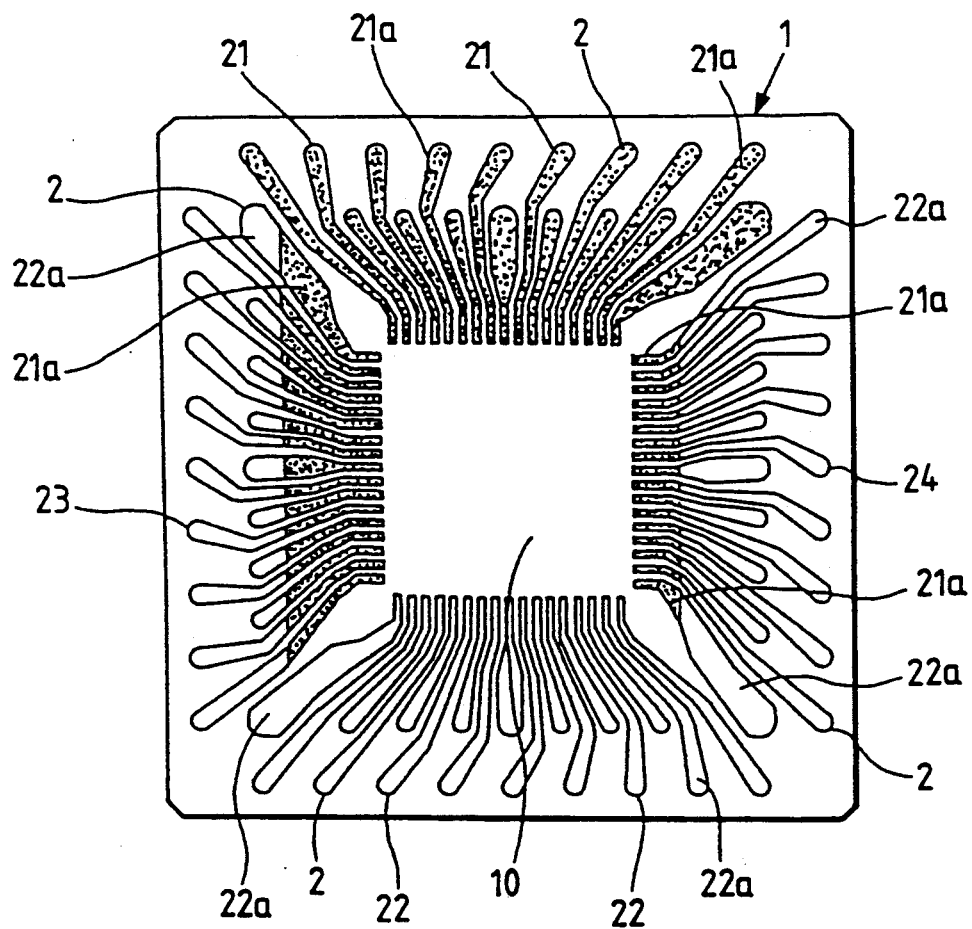
FIG. 1 is a plan view showing an embodiment of the ceramic multilayer wiring substrate according to the present invention.

The present invention includes a ceramic multilayer wiring substrate 1. The substrate 1 is composed of multilayer sintered matter of electrically insulating ceramics containing alumina ($Al_2O_3$) as its main component. The substrate 1 is square-shaped, essentially appearing as a flat plate having four cut corners and a central unoccupied region 10 for mounting a semiconductor chip thereon. A group of metallized wirings 2 are located on the surface of the ceramic multilayer wiring substrate 1 so as to extend outward from the central rectangular unoccupied space 10.

The group of metallized wirings 2 can be divided into isolated wirings 21, 22. Isolated wirings 21 are formed using a metallizing material having a low electrical resistivity value 21a. Isolated wirings 22 are formed using a metallizing material having a high electrical resistivity value 22a. The group of wirings 2 can be further divided into connecting wirings 23, 24 which are wirings containing metallizing materials of both high and low electrical resistivity values. Connecting wirings 23 are formed by a longer length of the metallizing material of low resistivity 21a than the metallizing material of high resistivity 22a. Connecting wirings 24 are the reverse. Connecting wirings 24 have a greater length of the high resistance metallizing material 22a than the low resistance metallizing material 21a.

The metallizing materials 21a, 22a contain a high melting point metal such as molybdenum (Mo) or tungsten (W) or a mixture of molybdenum and tungsten as the main component. The metallizing materials 21a, 22a further contain an insulating refractory material. The metallizing materials 21a, 22a are mixed in different proportions to the insulating refractory material depending on the amount of resistivity desired.

The metallizing materials 21a, 22a are generally printed onto the wiring substrate. Since the two materials 21a, 22a can be printed in different patterns from one another, a desired resistivity can be obtained at a predetermined wiring position without changing the final wiring group pattern 2. The resistivity can be altered by selectively superimposing the position of the patterns to obtain the best results.

To fabricate the ceramic multilayer wiring substrate 1, two kinds of conductive paste are needed. The conductive paste must contain a high melting point metal such as molybdenum (Mo) or tungsten (W). The high melting point material must then be mixed with a predetermined quantity of an insulating refractory material to form the conductive paste. The greater the quantity of the insulating refractory material added, the greater will be the electrical resistivity of the compound. The paste is then screen printed onto a green sheet substrate (a non-sintered ceramic material). The green sheet may be composed of alumina as its main material. A second green sheet is then laminated onto the first to sandwich the printed material. One possible method for laminating the second green sheet to the first is thermo-compression. The resultant assemblage is then baked in a humidified hydrogen furnace at about 1500° C. for about 3 hours. The electrical resistance of the connection wirings 23, 24 may be altered one of four ways by using the above-specified two kinds of metallizing materials having differing compositions.

Figure 2:
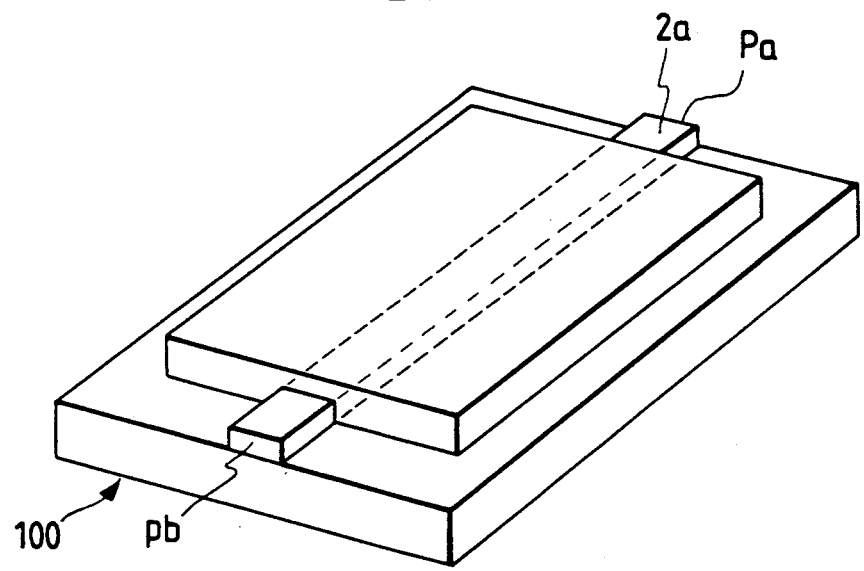
FIG. 2 is a perspective view showing a sample used to measure the sheet resistance, $R_s$, value of a metallizing material in which the metallizing material comprises, for example, molybdenum or tungsten and an insulating refractory material.
Figure 3:
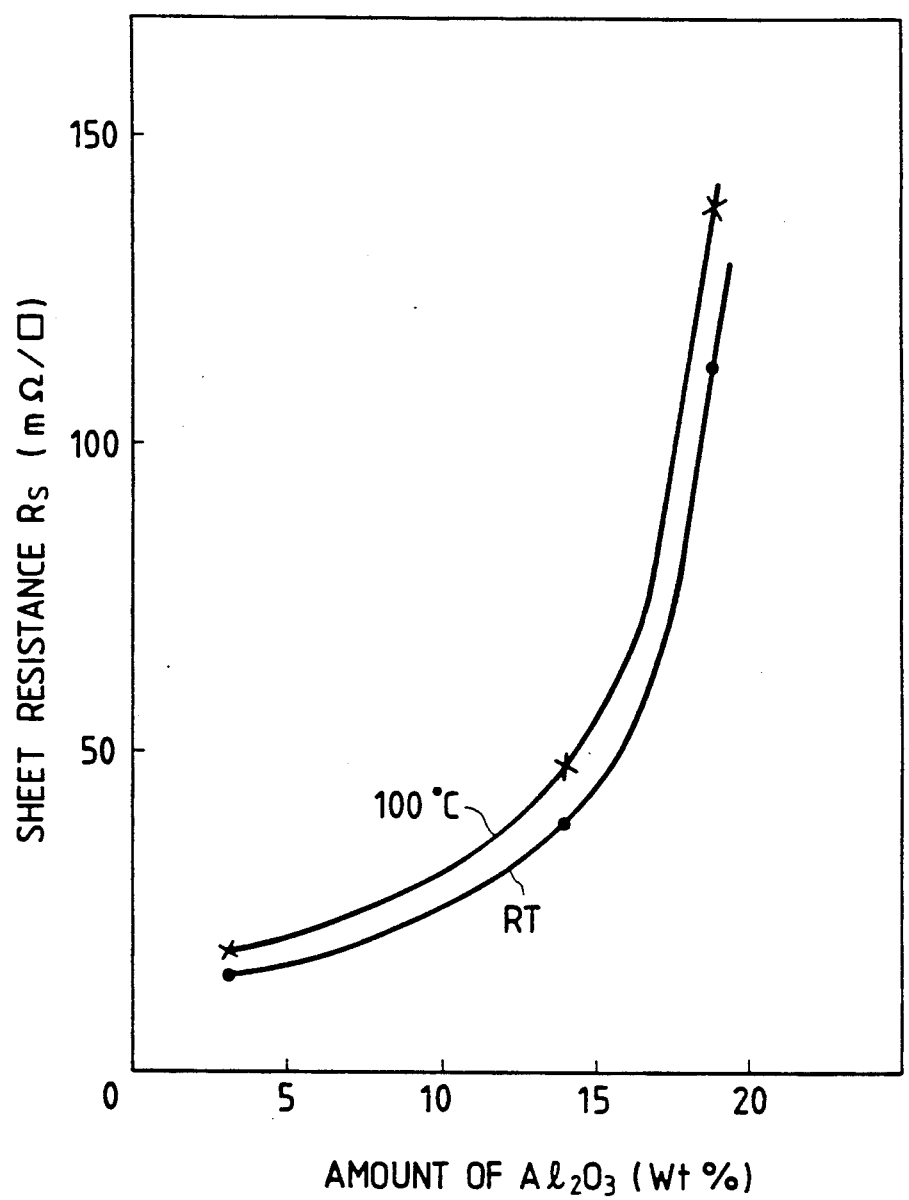
FIG. 3 is a graphical representation of the relationship between the sheet resistance of the metallizing material and the amount of insulating material added by weight percent. The values are measured at room temperature $R_T$ and 100° C.

FIG. 2 illustrates a sample 100 of the type used to generate the graph in FIG. 3. The sample 100 is a single wiring example having a metallized strip 2a extending between two green sheets. The insulating refractory material used in the metallized strip is alumina $Al_2O_3$. The sample 100 was prepared in accordance with the instructions provided above. The electrical resistivity of the metallized strip 2a in the sample 100 was measured between points $P_a$ and $P_b$ using the four terminal method. After measuring the resistivity of the metallized strip 2a, its length and width were measured to determine the sheet resistance, $R_s$ (m$\Omega$/□).

FIG. 3 graphically illustrates the relationship between the sheet resistance, $R_s$, and the weight percent (wt. %) content of alumina when alumina was used as the insulating refractory material. The sheet resistance value, $R_s$, increased at an accelerating rate with the increase of the alumina content. The sheet resistance value rapidly increased after the weight percent of alumina exceeded 20 wt. %. The metallizing material became almost non-conductive at 30 wt. % $Al_2O_3$, thereby rendering it useless as metallized wiring. The values were measured at room temperature (RT) and 100° C. Therefore, if various weight percentages of insulating refractory material are used (between 0–30 wt. %), a wide variety of resistances are possible in the metallizing material.

The present invention can be applied to ceramic multilayer wiring substrate 1 of almost all types using metallized wirings on a ceramic substrate. For example, a pin grid array (PGA), a chip carrier (C/C), a flat package, and the like are examples of possible uses of the present invention.

The present invention is not limited to the above alone, but does encompass the following as well. Although two kinds of metallizing materials having different resistances have been described, it is possible to use three or more metallizing materials each having differing resistances. The substrate 1 need not be limited to alumina but may include aluminum nitride (AlN), titania ($TiO_2$), or beryllia (BeO) to name a few. Moreover, the metallized wirings 2 need not be formed on the same plane. The present invention could apply to groups of metallized wirings 2 on different planes electrically connected to one another as long as the group of metallized wirings 2 are formed in one and the same substrate.

What is claimed is:

1. A wiring apparatus comprising:
    a substrate formed of an electrically insulative ceramic;
    a pattern formed on a surface of said substrate, said pattern including
    a plurality of first wirings composed of a first metallized material having an electrical resistivity of a first value; and
    a plurality of second wirings composed of a second metallized material having an electrical resistivity of a second value different from said first value.

2. The wiring apparatus according to claim 1, wherein the wiring pattern further includes a plurality of third wirings, each composed of said first metallized material and said second metallized material, said second metallized material being in electrical contact with said first metallized material.

3. The wiring apparatus according to claim 1, wherein each of said first and second metallized materials is composed of a high melting-point metal and an insulating refractory material, said insulating refractory material in said first metallized material being of a different percentage by weight than said second metallized material, said insulating refractory material being no greater than approximately 30 percent by weight for each of said first and second metallized materials.

4. The wiring apparatus according to claim 1, wherein said high melting-point metal includes molybdenum.

5. The wiring apparatus according to claim 1, wherein said high melting-point metal includes tungsten.

6. A multilayer wiring apparatus, comprising:
    a multilayer substrate including a plurality of laminated layers, said laminated layers formed of an electrically insulative ceramic;
    a plurality of first wirings forming a pattern and composed of a first metallized material having an electrical resistivity of a first value, said plurality of first wirings being formed on a surface of a first layer; and
    a plurality of second wirings forming a pattern and composed of a second metallized material having an electrical resistivity of a second value, said plurality of second wirings being formed on a surface of a second layer.

7. The multilayer wiring apparatus according to claim 6, further including a plurality of third wirings, each composed on said first metallized material and said second metallized material, said second metallized material being in electrical contact with said first metallized material.

8. The multilayer wiring apparatus according to claim 7, wherein said both first metallized material and said second metallized material of the third wirings are formed on a same layer.

9. The multilayer wiring apparatus according to claim 7, wherein said first metallized material and said second metallized material of the third wirings are formed on different layers.

10. The multilayer wiring apparatus according to claim 6, wherein each of said first and second metallized materials is composed of a high melting-point metal and a insulating refractory material, said insulating refractory material in said first metallized material being of a different percentage by weight than said second metallized material, said insulating refractory material being no greater than approximately 30 percent by weight for each of said first and second metallized materials.

11. The multilayer wiring apparatus according to claim 6, wherein said high melting-point metal includes molybdenum.

12. The multilayer wiring apparatus according to claim 6, wherein said high melting-point metal includes tungsten.

13. The multilayer wiring apparatus according to claim 6, wherein said ceramic comprises alumina ($Al_2O_3$).

14. The multilayer wiring apparatus according to claim 6, wherein said ceramic comprises aluminum nitride (AlN).

15. The multilayer wiring apparatus according to claim 6, wherein said ceramic comprises tinania ($TiO_2$).

16. The multilayer wiring apparatus according to claim 6, wherein said ceramic comprises beryllia (BeO).

17. The wiring apparatus according to claim 1, wherein said ceramic comprises alumina ($Al_2O_3$).

18. The wiring apparatus according to claim 1, wherein said ceramic comprises aluminum nitride (AlN).

19. The wiring apparatus according to claim 1, wherein said ceramic comprises titania ($TiO_2$).

20. The wiring apparatus according to claim 1, wherein said ceramic comprises beryllia (BeO).

* * * * *

UNITED STATES PATENT AND TRADEMARK OFFICE
CERTIFICATE OF CORRECTION

PATENT NO. : 5,060,049

DATED : October 22, 1991

INVENTOR(S) : Kozo Yamasaki et al.

It is certified that error appears in the above-identified patent and that said Letters Patent is hereby corrected as shown below:

Claim 7, column 5, line 1, change "on" to --of--.

Claim 10, column 5, line 20, before "insulating" change "a" to --an--.

Claim 15, column 6, line 14, change "tinania" to --titania--.

Signed and Sealed this

Twenty-fifth Day of May, 1993

Attest:

MICHAEL K. KIRK

Attesting Officer

Acting Commissioner of Patents and Trademarks